United States Patent [19]

Ohashi

[11] Patent Number: 4,707,765
[45] Date of Patent: Nov. 17, 1987

[54] PRINTED WIRING BOARD MOUNTED CONTROL INSTRUMENT

[75] Inventor: Shigeo Ohashi, Tokyo, Japan

[73] Assignee: Nihon Kaiheiki Kogyo Kabushiki Kaisha, Tokyo, Japan

[21] Appl. No.: 713,610

[22] Filed: Mar. 19, 1985

[30] Foreign Application Priority Data

Jul. 26, 1984 [JP] Japan .................................. 59-155774
Oct. 3, 1984 [JP] Japan .................................. 59-207515

[51] Int. Cl.⁴ .............................................. H05K 1/18
[52] U.S. Cl. .................................. 361/401; 200/296;
248/27.3
[58] Field of Search .............................. 200/294–296;
248/27.1, 27.3; 339/17 LC; 361/400, 401, 350, 351, 353

[56] References Cited

U.S. PATENT DOCUMENTS

| | | | |
|---|---|---|---|
| 3,215,975 | 11/1965 | Kinkaid | 339/17 LC |
| 3,706,869 | 12/1972 | Sorenson | 200/294 |
| 4,079,284 | 3/1978 | Fanshawe | 361/401 |
| 4,159,405 | 6/1979 | Semonchik et al. | 200/296 |
| 4,220,303 | 9/1980 | Stoldt | 361/400 |
| 4,400,674 | 8/1983 | Suda et al. | 361/401 |
| 4,406,936 | 9/1983 | Ohashi | 200/296 |
| 4,461,938 | 7/1984 | Sorenson | 200/296 |

FOREIGN PATENT DOCUMENTS

| | | | |
|---|---|---|---|
| 1294087 | 4/1962 | France | 361/401 |
| 937192 | 9/1963 | United Kingdom | 361/400 |

Primary Examiner—A. D. Pellinen
Assistant Examiner—Gregory D. Thompson
Attorney, Agent, or Firm—Birch, Stewart, Kolasch & Birch

[57] ABSTRACT

A control instrument which is mounted in a recess on a printed wiring board is disclosed. The control instrument includes terminals, provided at a bottom surface and offset from a central plane, which engage pattern portions formed at a bottom section of the recess. A resilient member is provided over a top portion the control instrument. Leg members of the resilient member extend over opposite side walls the control instrument. The leg members project outward at a central portion and have apertures formed therein. The control instrument can also have longitudinal grooves over which the leg members extend.

13 Claims, 18 Drawing Figures

PRINTED WIRING BOARD MOUNTED CONTROL INSTRUMENT

BACKGROUND OF THE INVENTION

The present invention relates to a control instrument including various kinds of switches, for example, a toggle switch, a push button, a display lamp, a connector or a variable resistor. More particularly, the present invention relates to a printed wiring board control instrument which can be mounted on a printed wiring board.

Conventionally, devices of this kind are mounted on a printed wiring board as follows: in a switch, as shown in FIG. 1, terminals 13 projecting from the bottom surface of a switch body 11 are first bent at right angles and a mounting plate 16 with a projection 16a is attached to the switch body 11 so as to form a projection-groove type engagement at 16b. The switch body 11 includes, at its upper portion, a substantially cylindrical sleeve 12. Inside of the switch body is a switching element, operated by a handle 15. Then, the bent terminals 13 of the switch and the projection 16a of the mounted plate 16 are inserted into corresponding apertures of the printed wiring board, 17 respectively, and the switch is rigidly mounted on the printed wiring board 17 by soldering.

However, electronic instruments become very compact due to rapid developments in this field. Therefore, when switches which are, in general, larger than semiconductor devices are mounted on the upper surface of a printed wiring board, they occupy a large amount of space and thus to eliminate any compactness of the instrument. Moreover, where a plurality of printed wiring boards are disposed in parallel and one above another, there has been a problem in reducing projections extending from the surfaces of the printed wiring boards to reduce the size of the gaps between the printed wiring boards.

SUMMARY OF THE INVENTION

It is therefore, an object of the present invention to provide a novel printed wiring board control instrument which is capable of reducing the amount of space occupied by printed wiring board control instruments such as switches which are generally larger than semiconductor devices.

In order to accomplish this and other objects, there is provided a printed wiring board and control instrument disposed in a recess formed in a printed wiring board to be mounted thereon by a projection-groove engagement between end surfaces of the recess of a printed wiring board and end surfaces of the control instrument.

BRIEF DESCRIPTION OF THE DRAWINGS

The present invention will become more fully understood from the detailed description given hereinbelow and the accompanying drawings which are given by way of illustration only, and thus are not limitative of the present invention, and wherein.

DESCRIPTION OF THE PREFERRED EMBODIMENTS

The embodiments of the present invention will now be described in detail with reference to the accompanying drawings.

Figure 1:
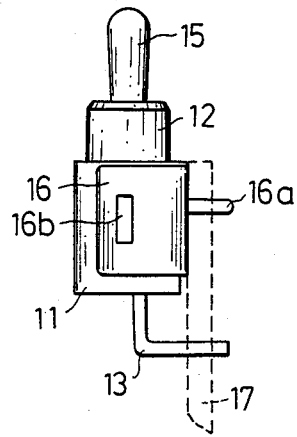
FIG. 1 is a side view of a switch device of the prior art.
Figure 2:
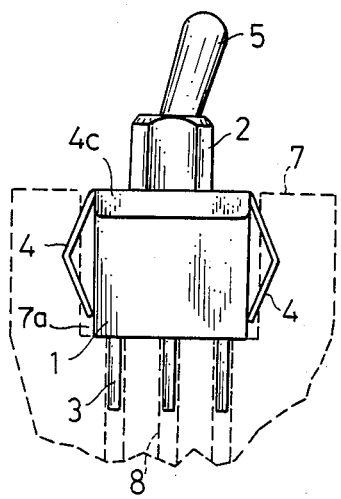
FIG. 2 is a front view of a first embodiment according to the present invention.
Figure 3:
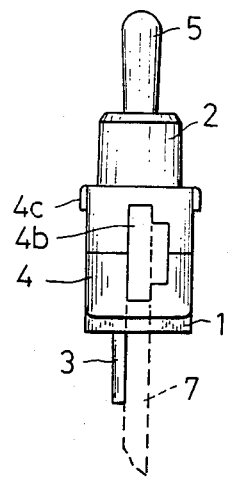
FIG. 3 is a side view of the first embodiment.
Figure 4:
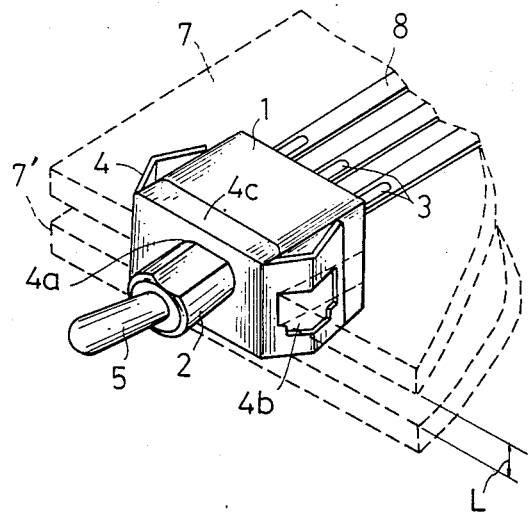
FIG. 4 is a perspective view of the first embodiment.

In FIGS. 2 to 4, reference numeral 1 indicates a switch body. Disposed within the switch body 1 is a switching element, not shown, which is opened and closed by operation of a handle 5. The switch body 1 is formed at its upper portion with a substantially cylindrical sleeve 2 and provided at its bottom surface with three terminals 3 which are offset from the center line of the switch body 1 ( to the left as viewed in FIG. 3 ).

A U-shaped resilient member 4 is provided at its upper surface or its web portion with an openning 4a and has leg portions at opposite end edges of the web portion ( at right and left end edges as viewed in FIG. 2 ). Each leg portion is bent to project outward at its central portion and is provided with a longitudinally elongated aperture 4b. The resilient member 4 is press fitted onto the sleeve 2 of the switch body 1 to be rigidly attached thereto. Alternatively, the resilient member 4 may be mounted on the switch body 1 so as to form a projection-groove type relationship or may be integrally formed with the switch body 1 by molding. In FIG. 2, extending pieces 4c which vertically extend from the upper portion of the resilient member 4 at its opposite side edges or its front and rear side edges prevent twisting and bending, and increase the strength of the construction.

Now, the manner of mounting the above-mentioned switch on a printed wiring board will be described. A printed wiring board 7 is formed at its end portion with a rectangular cut-out or recess 7a. The switch assembled by attachment of the resilient member 4 to the switch body 1 is inserted downward into the recess 7a as viewed in FIG. 2 or FIG. 3 so that the switch is located in a position within the recess 7a by insertion of the opposite side portions of the recess 7a into the corresponding opposite apertures 4b of the resilient member 4. At that time, since the leg portions of the resilient member are bent to project outward, the leg portions are pushed inward at the upper and lower ends of the apertures 4b by the opposite side portions of the recess 7a and then the switch is rigidly mounted on the printed wiring board 7.

Since the terminals 3 are disposed at the bottom surface of the switch body 1 to be offset from the center line thereof, the terminals 3 are engaged with the pattern 8 formed on the upper surface of the printed wiring board 7 and are fixed thereto. Furthermore, the terminals are fixed to the pattern more rigidly by soldering.

Figure 5A:
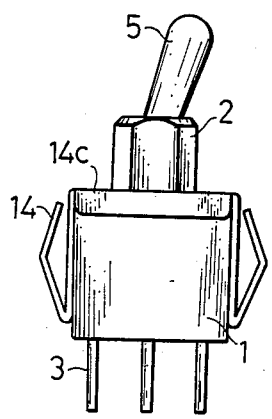
FIG. 5a is a front view of a second embodiment according to the present invention.
Figure 5B:
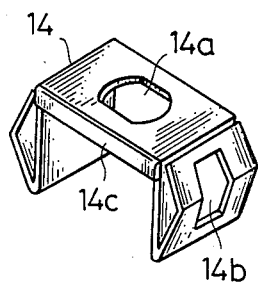
FIG. 5b is a perspective view of a resilient member for use in the second embodiment.

FIGS. 5a and 5b show a second embodiment of the present invention. More particularly, FIG. 5a is a front view of a switch and FIG. 5b is a perspective view of a modified resilient member for use with the switch body. In FIGS. 5a and 5b, a V-shaped resilient member 14 is provided at its upper portion with an opening 14a through which the sleeve 2 is fitted, and at its opposite end with leg portions. Each leg portion is first folded to vertically extend downward and then folded back to extend upward. However, the second upward folded portion of the leg portion is adapted to project outward at its center portion and to be formed with an aperture 14b. Pieces 14c vertical extend from the upper portion of the resilient member 14 at its upper side edges or its front and rear side edges to prevent twisting and bending and to incease the strength of the construction.

Figure 6A:
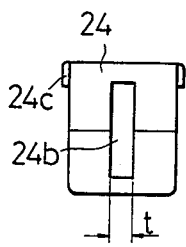
FIG. 6a is a side view of a modified resilient member.
Figure 6B:
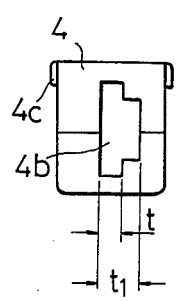
FIG. 6b is a side view of a resilient member for use in the first embodiment.
Figure 6C:
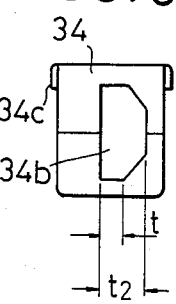
FIG. 6c is a side view of another modified resilient member.

FIGS. 6a to 6c are side views of various modified forms of the resilient member according to the present invention. FIG. 6a shows an example wherein an aperture 24b of the resilient member 24 is formed to be exclusively adapted for the printed wiring board of thickness t. In other words, the resilient member 24 is only attached to a printed wiring board of thickness t. FIG. 6b shows one of stair-shaped apertures 4b formed in the leg portions which was already described to be used in the first embodiment shown in FIGS. 2 to 4. The aperture 4b is provided with a step portion at its right side as viewed in FIG. 6b The resilient member with the aperture 4b is attached to a printed wiring board of thickness t or t1. FIG. 6c shows barn-shaped apertures 34b formed in the leg portions of a resilient member 34. The aperture 34b has an inclined portion at its right side as viewed in FIG. 6c in its width direction and, therefore, the resilient member 34 is optionally attached to a printed wiring board of a thickness within the range of t to t2. Pieces 24c (FIG. 6a), 4c (FIG. 6b), and 34c (FIG. 6c), vertically extend from the upper portion of the resilient member 24 (FIG. 6a), 4c (FIG. 6b), and 34c (FIG. 6c), at its upper side edges or its front and rear side edges, prevent twisting and bending, and increase the strength of construction.

Although, the resilient member shown in FIG. 6b, is usually used with the printed wiring board of thickness t as shown in FIGS. 2 to 4, when it is used with the printed wiring of thickness tl, it is preferable that the recess formed in the printed wiring board for mounting the switch therein is slightly larger. However, if the outward projecting leg portion of the resilient member 4 is made more flat, the recess of the printed wiring board may be as large as that in the case of the printed wiring board of thickness t. For similar reasons in the case, in case of the resilient member of FIG. 6c, the same or larger recess may be formed in the printed wiring board of thickness within the range of t to t1.

While in the above-mentioned embodiments it has been described that the recess provided in the printed wiring board for mounting the switch therein is formed at the end portion of the printed wiring board, it should not be limited to the end of the printed wiring board, because it may be provided on any suitable portion of the printed wiring board.

Furthermore, it has been described that the side surfaces of the recess of the the printed wiring board are brought into direct contact with the apertures of the resilient member, it should not be limited to this arrangement. For example, the recess may be formed at its side surfaces with projections or grooves, while the switch body may be provided at its end surfaces with grooves or projections, and thus the switch may be mounted on the printed wiring board by engaging the projections or grooves of the switch body with corresponding grooves or projections of the recess of the printed wiring board.

Furthermore, in the present invention, the switch can be mounted on the printed wiring board in positions symmetrical to the center line of the printed wiring board, and can be constructed to be mounted in a suitable offset position depending on the position of the aperture.

In accordance with the above-mentioned first and second embodiments of the present invention, the switch can be attached to the printed wiring board at by providing the recess at the end portion of the printed wiring board and inserting the switch into the recess of the printed wiring board with the assistance of the resilient member which has outward projecting leg portions with apertures engageable with the side surfaces of the recess and which is attached to the switch body. Moreover, by soldering the terminals of the switch to the pattern of the printed wiring board, the switch can be rigidly mounted on the printed wiring board.

Attachment of the switch to the printing wiring board by utilizing the recess thereof allows space within the machine to be enlarged by the thickness of the printed wiring board. In other words, this is equivalent to making the volume of the switch smaller by the thickness of the printed wiring board. Moreover, in a case where a plurality of printed wiring boards 7 and 7′ are disposed in parallel one above another as shown in FIG. 4, the distance L of the gap between the printed wiring boards can be decreased by less than half.

The bending of the leg portions of the resilient member outward and the provision of the step portions in the apertures allow the resilient member to be attached to a printed wiring board having varying degress of thickness , for example, 1.2 mm or 1.6 mm. Furthermore, by providing inclined portions in the apertures, it also can be applied to printed wiring boards of varying thicknesses. Moreover, since the resilient member is attached to the printed wiring board on the basis of one side surface of the aperture, even if thickness of the printed wiring board varies, the terminals of the switch can be attached to the printed wiring board so that it contacts the pattern or the printed wiring board.

Since the thickness of the printed wiring board corresponds to the width of longitudinal apertures of the resilient member, there is no play between the printed wiring board and the apertures, and therefore the switch can be rigidly attached to the printed wiring board.

In FIGS. 7 to 10, reference numeral 41 indicates a switch body. The switch body 41 is provided with a switching element, not shown, operable by a handle 45. The switch body 41 is formed at its upper portion with a substantially cylindrical sleeve and provided at its bottom surface with three terminals 43 which are offset from the center line of the switch body to the left as viewed in FIG. 9.

Figure 7:
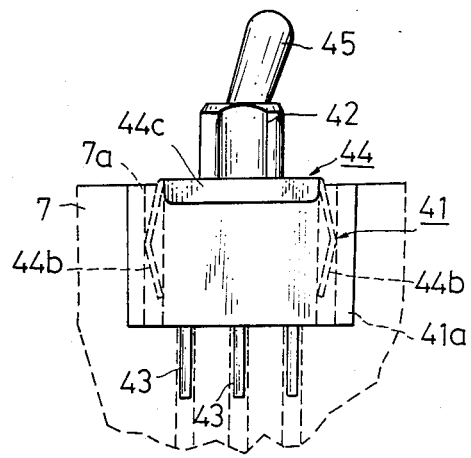
FIG. 7 is a front view of a third embodiment according to the present invention.
Figure 8A:
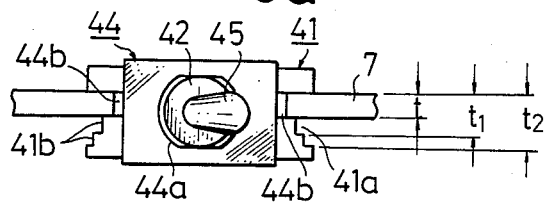
FIG. 8a is a plan view of a modified form of the third embodiment.
Figure 8B:
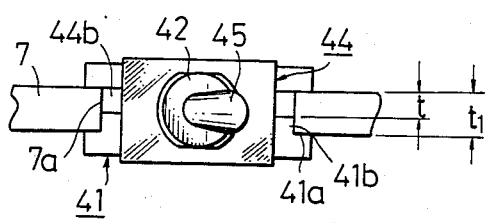
FIG. 8b is a plan view of the third embodiment.
Figure 8C:
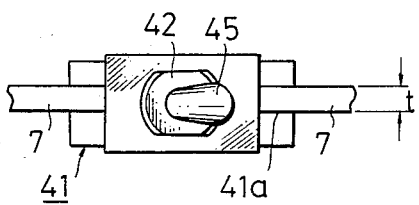
FIG. 8c is a plan view of another modified form of the third embodiment.
Figure 9:
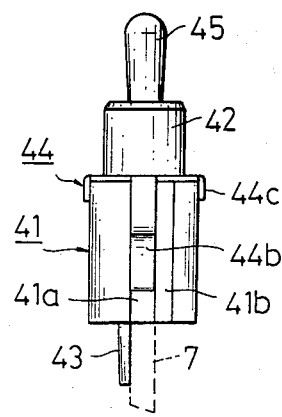
FIG. 9 is a side view of the third embodiment.
Figure 10:
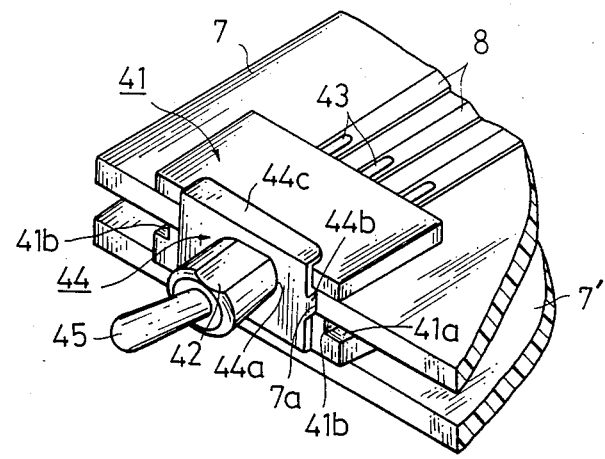
FIG. 10 is a perspective view of a switch of the third embodiment mounted on a printed wiring board.

The switch body 41 is provided at its opposite end portions, i. e. at right and left end portions as viewed in FIG. 7, with longitudinal grooves 41a which are engaged with the side surfaces of the recess 7a formed in the printed wiring board 7. At least one step portion 41b may be formed within the longitudinal groove 41a, if desired. In FIG. 8a, two step portions 41b are provided and in FIG. 8b, one step portion 41b is provided. FIG. 8c shows a case where no step portion is formed. In FIG. 8a, the switch body 41 can be used with the printed wiring board of thickness t, t1 or t2, and in FIG. 8b, the switch body 41 can be used with the printed wiring board of thickness t or t1, and in FIG. 8c, the switch body is used with the printed wiring board of thickness t exclusively.

A U-shaped resilient member, which is formed at its upper portion with an opening 44a into which the sleeve 42 is fitted and which has leg portions bent to extend outward at approximately central portions thereof, is fitted onto the sleeve 42 to be rigidly attached thereto. The leg portions 44b which are formed to extend outward within the longitudinal grooves serve as actual resilient elements. Alternatively, the resilient member 44 may be attached to the switch body 41 so as to form a projection-groove type relationship or may be integrally formed with the switch body by molding. In FIG. 7, extending pieces 44c which extend from the front and rear side edges of the resilient member prevent twisting and bending, and increase the strength of the construction.

Now, the manner of mounting the switch on the printed wiring board in the third embodiment according to the present invention will be described. The stepped recess 7a is provided in the end portion of the printed wiring board 7. When the switch, which is assembled by attaching the resilient member 44 to the switch body 41, is inserted into the printed wiring board 7 from the upper position as viewed in FIGS. 7 or 9, the longitudinal grooves 41a of the switch body 41, the width of which corresponds to the thickness of the printed wiring board 7, come into engagement with the recess 7a and the opposite surfaces adjacent the side portions of recess 7a are clamped by the longitudinal grooves formed in the switch body. The side portions of the recess 7a are then pushed by leg portions 44b of the resilient member 44. At that time, since the leg portions, i. e. resilient elements are bent to project outward a, strong force is obtained and thus the switch is rigidly mounted on the printed wiring board.

Since the switch body 41 is provided at its bottom surface with terminals 43 which are offset from the center line of the switch body, the terminals 43 are brought into contact with the pattern 8 formed on one surface of the printed wiring board. Moreover, the terminals 43 are rigidly attached to the pattern 8 by soldering.

Figure 11:
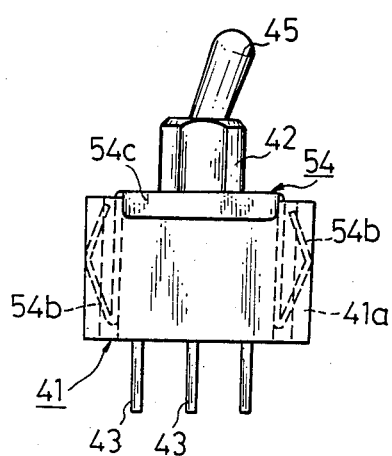
FIG. 11 is a front view of a fourth embodiment according to the present invention.

FIG. 11 is a front view of a fourth embodiment of the present invention. In FIG. 11, a U-shaped resilient member 54 is provided at its upper surface with an opening into which the sleeve is fitted and has leg portions or resilient elements 54b. The leg portions are bent to extend vertically downward and again bent to extend upward. The central portions of the leg portions are formed to project outward. Pieces 54c vertically extend from the upper portion of the resilient member 54 at its upper side edges or its front and rear edges to prevent twisting and bending and to increase the strength of the construction.

Figure 12:
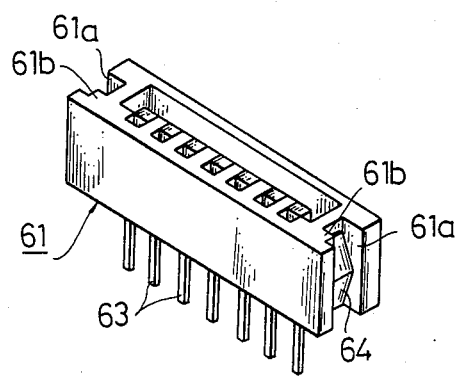
FIG. 12 is a perspective view of a fifth embodiment according to the present invention.
Figure 13:
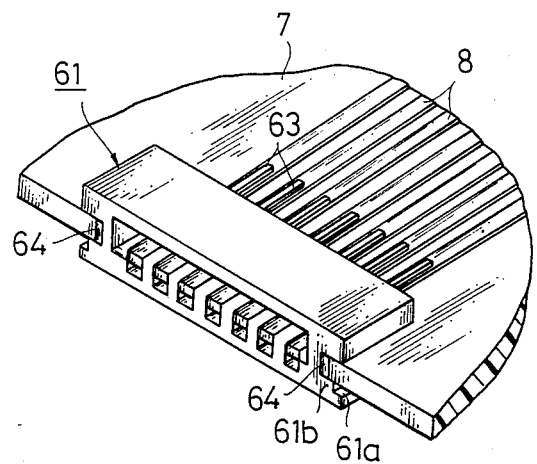
FIG. 13 is a perspective view of a connector of the fifth embodiment mounted on a printed wiring board.

FIG. 12 is a perspective view of a connector of the fifth embodiment and FIG. 13 is a perspective view of the connector mounted on the printed wiring board.

In FIGS. 12 and 13, reference numeral 61 indicates a connector body. The connector 61 is formed at its opposite end portions with longitudinal grooves 61a with which the side portions of the recess 7a formed in the printed wiring board 7 are engaged. Step portions 61b may be formed within the longitudinal grooves 61a similar to those of the third embodiment, if desird. Therefore, various kinds of printed wiring boards of different thicknesses can be used in accordance with the number of steps. Leg portions or resilient elements 64 are provided within the longitudinal grooves 61a.

Since the manner of mounting the connector on the printed wiring board is similar to that of the third embodiment, the detailed explanation thereof will be omitted.

While it has been described that the present invention is applied to a switch and a connector, it also can be applied to a display lamp, a variable resistor, etc.

Moreover, when the control instrument according to the present invention is pulled out of the printed wiring board with the leg portions of the resilient member being clamped by fingers it can be easily removed from the printed wiring board.

With the third through fifth embodiments of the present invention, the following advantages can be obtained:

Since the printed wiring board is clamped by the grooves formed on the opposite end portions of the switch body or the connector body and the leg portions or resilient elements push the side surfaces of the recess formed in the printed wiring board by a strong force, the control instrument can be mounted on the printed wiring board more rigidly, compared with conventional ones.

The control instrument can be inserted into printed wiring board easily.

By bending the terminals toward the printed wiring board slightly, the terminals can be positively brought into contact with the pattern of the printed wiring board, which can eliminate soldering. Moreover, by soldering, the electric connections can be made perfect.

By forming a plurality of step portions within the longitudinal grooves provided on the switch body or connector body, the control instrument can be mounted on printed wiring boards of various thicknesses.

Since the terminals are provided on the basis of one side edge of the longitudinal groove, the distance between the terminals and the upper surface of the printed wiring board is maintained constant and thus the terminals are always brought into contact with the upper surface of the printed wiring board when the control instrument is mounted on the printed wiring board.

The invention being thus described, it will be obvious that the same may be varied in many ways. Such variations are not to be regarded as a departure from the spirit and scope of the invention, and all such modifications as would be obvious to one skilled in the art are intended to be included within the scope of the following claims.

What is claimed is:

1. A control instrument being mounted on a printed wiring board having a recess formed therein, comprising:
   a plurality of terminals, provided at a bottom surface and offset from a central plane of said control instrument, engaging electrical pattern portions formed at a bottom section of said recess; and
   a resilient member provided over a top portion of said control instrument and having leg portions which extend over opposite side walls of said control instrument, said leg portions projecting outward at a central portion thereof and having apertures formed therein resiliently engaging inner walls of said recess.

2. The control instrument of claim 1, wherein said resilient member includes second leg portions which extend over side walls of said control instrument.

3. The control instrument of claim 1, wherein said apertures are rectangular in shape.

4. The control instrument of claim 3, wherein at least one edge of said rectangle is stair-shaped.

5. The control instrument of claim 1, wherein said apertures are barn-shaped.

6. The control instrument of claim 1, wherein each leg portion includes one leg portion which extends over a side wall of said control instrument, and a second leg portion, disposed outside of said one leg portion and connected thereto, projecting outward at a central portion thereof and having an aperture formed therein resiliently engaging an inner wall of said recess.

7. The control instrument of claim 1, wherein said resilient member constitutes a main plate member connected to said leg portions covering a top surface of said control instrument and supporting said leg portions.

8. The control instrument of claim 2, wherein said resilient member constitutes a main plate member connected to said leg portions and said second leg portions covering a top surface of said control instrument and supporting said leg portions and said second leg portions.

9. A control instrument being mounted on a printed wiring board having a recess formed therein, comprising:
   a plurality of terminals, provided at a bottom surface and offset from a central plane of said control instrument, engaging electrical pattern portions formed at a bottom section of said recess;
   longitudinal grooves provided on opposite end walls of said control instrument engaging side surfaces of said printed wiring board adjacent said recess thereof; and
   a resilient member provided over a top portion of said control instrument and having leg portions which extend over said longitudinal grooves, said leg portions projecting outward at a central portion thereof and having apertures formed therein resiliently engaging side surfaces of said recess.

10. The control instrument of claim 9, wherein said grooves are rectangular in shape and at least one edge of said rectangle is stair-shaped.

11. The control instrument of claim 9, wherein said resilient member includes second leg portions which extend over side walls of said control instrument.

12. The control instrument of claim 9, wherein each leg portion includes one leg portion which extends over a side wall of said control instrument, and a second leg portion, disposed outside of said one leg portion and connected thereto, projecting outward at a central portion thereof and having an aperture formed therein resiliently engaging an inner wall of said recess.

13. The control instrument of claim 11, wherein said resilient member constitutes a main plate member connected to said leg portions and said second leg portions covering a top surface of said control instrument and supporting said leg portions and said second leg portions.

* * * * *